United States Patent
Gaynes et al.

(10) Patent No.: US 6,492,724 B2
(45) Date of Patent: Dec. 10, 2002

(54) STRUCTURE FOR REINFORCING A SEMICONDUCTOR DEVICE TO PREVENT CRACKING

(75) Inventors: Michael Anthony Gaynes, Vestal, NY (US); Mark Vincent Pierson, Binghamton, NY (US); Aleksander Zubelewicz, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/798,829

(22) Filed: Mar. 2, 2001

(65) Prior Publication Data

US 2001/0009277 A1 Jul. 26, 2001

Related U.S. Application Data

(62) Division of application No. 09/239,382, filed on Jan. 28, 1999, now Pat. No. 6,197,619.

(51) Int. Cl.[7] .............................................. H01L 23/34
(52) U.S. Cl. ........................ 257/707; 257/713; 257/717; 257/720; 257/738; 257/778; 257/780; 361/704; 361/709; 361/711; 361/718; 361/719
(58) Field of Search ................................ 257/706, 707, 257/717, 720, 712, 713, 737, 738, 778, 779, 780; 438/106, 108, 121, 122, 118, 119; 361/704, 705, 709, 711, 718, 719

(56) References Cited

U.S. PATENT DOCUMENTS

| | | | |
|---|---|---|---|
| 3,986,251 A | 10/1976 | Altemus et al. ............... 29/590 |
| 4,035,830 A | 7/1977 | Kim ........................... 257/748 |
| 4,147,889 A * | 4/1979 | Andrews et al. ............ 174/52.4 |
| 4,181,249 A | 1/1980 | Peterson et al. ............. 228/121 |
| 4,293,587 A | 10/1981 | Trueblood .................. 438/652 |
| 4,321,617 A | 3/1982 | Duda et al. .................. 257/751 |
| 4,323,914 A * | 4/1982 | Berndlmaier et al. ........ 257/713 |
| 4,434,434 A | 2/1984 | Bhattacharya ............... 257/737 |
| 4,451,972 A | 6/1984 | Batinovich .................... 29/583 |
| 4,535,219 A | 8/1985 | Sliwa, Jr. ................ 219/121.63 |
| 4,772,935 A | 9/1988 | Lawler et al. ............... 257/751 |
| 4,866,505 A | 9/1989 | Roberts et al. .............. 257/782 |
| 5,161,728 A | 11/1992 | Li ................................ 228/124 |
| 5,183,972 A | 2/1993 | Duane et al. ................. 174/251 |
| 5,230,924 A | 7/1993 | Li ................................ 427/229 |
| 5,248,079 A | 9/1993 | Li ................................ 228/121 |
| 5,392,982 A | 2/1995 | Li ............................ 228/124.5 |
| 5,672,548 A * | 9/1997 | Culnanae et al. ............ 438/118 |
| 5,847,929 A * | 12/1998 | Bernier et al. ............... 361/179 |
| 5,909,056 A * | 6/1999 | Mertol ......................... 257/704 |
| 5,942,794 A | 8/1999 | Okumura et al. ............ 257/666 |
| 5,990,418 A * | 11/1999 | Bivona et al. ............... 257/704 |
| 6,013,109 A | 1/2000 | Choi ........................... 438/124 |
| 6,197,619 B1 * | 3/2001 | Gaynes et al. .............. 438/124 |
| 6,376,907 B1 * | 4/2002 | Takano et al. ............... 257/704 |

FOREIGN PATENT DOCUMENTS

JP          7-135176          7/1995

* cited by examiner

Primary Examiner—David L. Talbott
Assistant Examiner—Alonzo Chambliss
(74) Attorney, Agent, or Firm—Schmeiser, Olsen & Watts; Lawrence R. Fraley

(57) ABSTRACT

A structure and methods for reinforcing a semiconductor device to prevent cracking is provided. The device may take the form of a semiconductor chip or a semiconductor chip package. When a semiconductor chip is provided, an adhesion layer is applied over its top surface, followed by the application of a reinforcing layer over the adhesion layer. When a semiconductor chip package is provided, the package first undergoes a cleaning process, followed by the application of an adhesion layer over its top surface and, lastly, the application of a reinforcing layer over the adhesion layer.

12 Claims, 5 Drawing Sheets

US 6,492,724 B2

STRUCTURE FOR REINFORCING A SEMICONDUCTOR DEVICE TO PREVENT CRACKING

This application is a divisional of U.S. Pat. Ser. No. 09/239,382 filed on Jan. 28, 1999 U.S. Pat. No. 6,197,619.

BACKGROUND OF THE INVENTION

1. Technical Field

The present invention generally relates to a structure and method for reinforcing a semiconductor device, and more particularly, to a structure and method for preventing the cracking of a semiconductor device during thermal cycling or mechanical loading.

2. Background Art

In the production of integrated circuitry, a semiconductor device is often affixed to an organic substrate, such as an organic chip carrier having distinct material properties. For example, under present technology, the semiconductor device can be formed from silicon, gallium, arsenide, or the like, whereas the organic substrate can be made from epoxy, cyanate ester or other similar base. This difference in materials comprising the components often leads to problems during fabrication and use when a semiconductor device is subject to thermal cycling. Specifically, the different materials have distinct coefficients of thermal expansion (CTE) which, upon thermal cycling, cause the bottom surface (commonly referred to as the "front" or "metalization" surface) of the semiconductor device to expand and contract at a different rate than its top surface (commonly referred to as the "back" or "free" surface). When this occurs, the flexibility of the substrate will cause the more rigid semiconductor to bend and crack resulting in failure or significant decrease in performance of the semiconductor device.

Thus, the ability of a semiconductor device to withstand the thermal cycling process is important in ensuring optimal performance of integrated circuitry.

Heretofore, many manufacturers have applied a metallic liner to a semiconductor device before mounting the device on a substrate. One such example of this is shown in U.S. Pat. No. 4,866,505 to Roberts et al., hereby incorporated by reference. Recognizing the problems associated with differing coefficients of thermal expansion, Roberts et al. teaches coating the underside of the semiconductor device with a metallic liner prior to bonding the device to the substrate. The purpose of this is to increase the area of the device that contacts the substrate as the two are bonded together. While such an embodiment may result in enhanced bonding of the device to the substrate, it will not aid in the prevention of cracking on the surface of the device and, accordingly, device performance will continue to suffer.

Therefore, there exists the need for a reinforced semiconductor device that will not crack or otherwise become defective upon thermal cycling.

SUMMARY OF THE INVENTION

The present invention overcomes the deficiencies of the prior art by including a structure and method for preventing cracking of a semiconductor device due to warping or other effects that occur during thermal cycling or mechanical loading by reinforcing the device's top surface.

According to one aspect of the invention, a method of reinforcing a semiconductor chip to prevent cracking is provided comprising the steps of: 1) providing a semiconductor chip having a top and a bottom surface; 2) applying an adhesion layer over the top surface of the semiconductor chip; and 3) by applying a reinforcing layer over the adhesion layer to prevent cracking of the chip.

According to a second aspect of the invention, a method for preventing cracking of a semiconductor chip package is provided and comprises the steps of: 1) providing a semiconductor chip package having a top and a bottom surface; 2) cleaning the chip package; 3) applying an adhesion layer over the top surface of the chip package; and 4) applying a reinforcing layer over the adhesion layer to prevent cracking of the chip package.

According to a third aspect of the present invention, a reinforced semiconductor device is provided which comprises a semiconductor device having a top and a bottom surface and a reinforcing layer overlying the top surface. The device can comprise either a semiconductor chip or a semiconductor chip package.

It is therefore a further advantage of the present invention to provide a structure and methods for reinforcing a semiconductor device to prevent cracking during thermal cycling.

It is therefore an advantage of the present invention to provide a structure and methods for maintaining optimal performance of a semiconductor device irrespective of thermal cycling.

BRIEF DESCRIPTION OF THE DRAWINGS

These and other features and advantages of this invention will be more readily understood from the following detailed description of the various aspects of the invention taken in conjunction with the accompanying drawings in which.

DETAILED DESCRIPTION OF THE PREFERRED EMBODIMENTS

Figure 1:
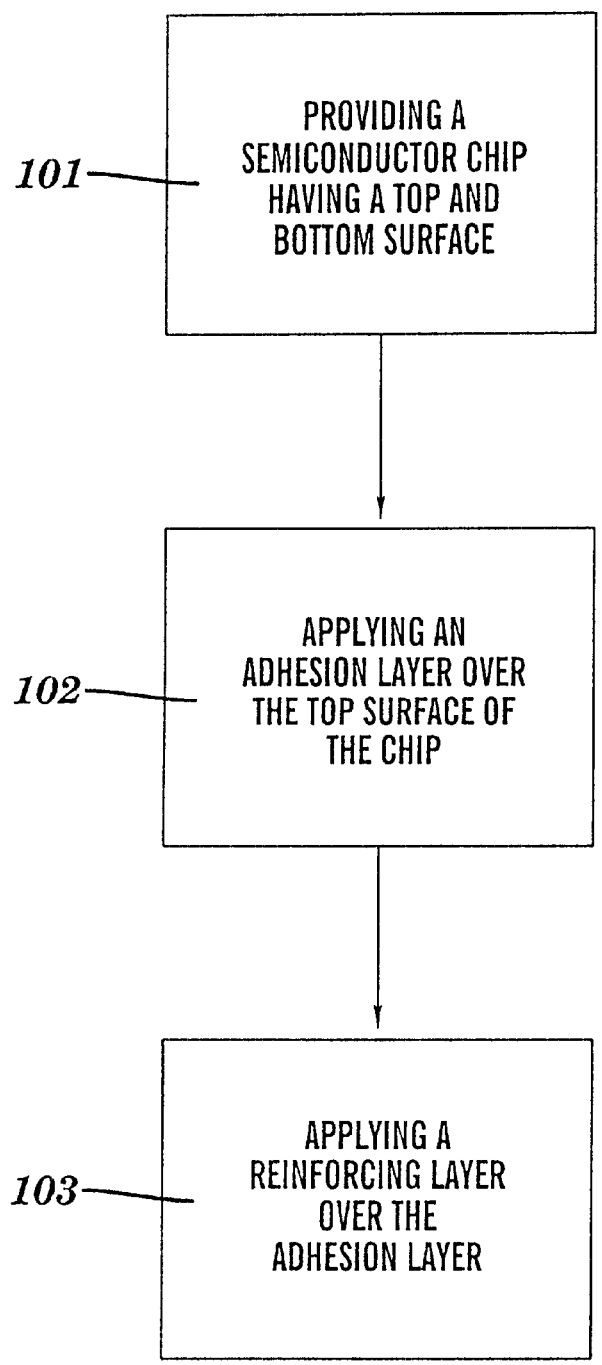
FIG. 1 is a flow diagram of the method of the first embodiment of the present invention.
Figure 3:
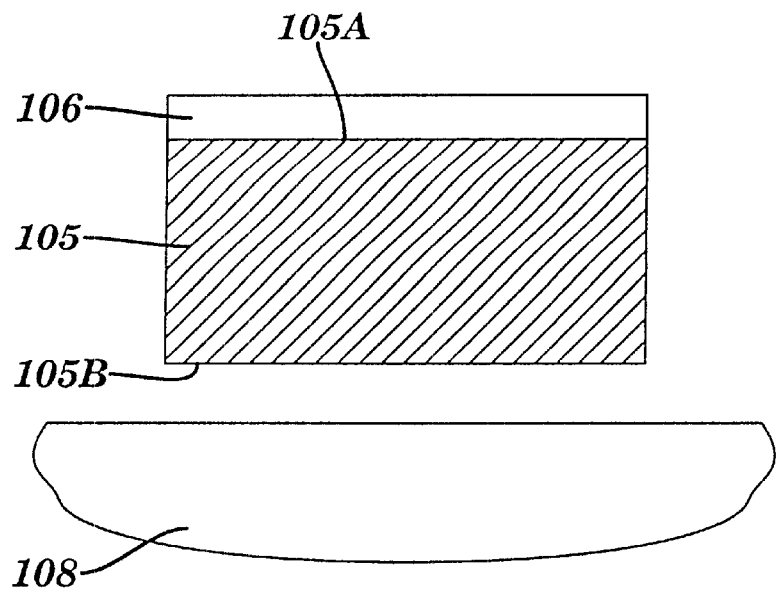
FIG. 3 is a cross-sectional view of a semiconductor chip having an adhesion layer thereon, in accordance with the method of the first embodiment of the present invention.
Figure 4:
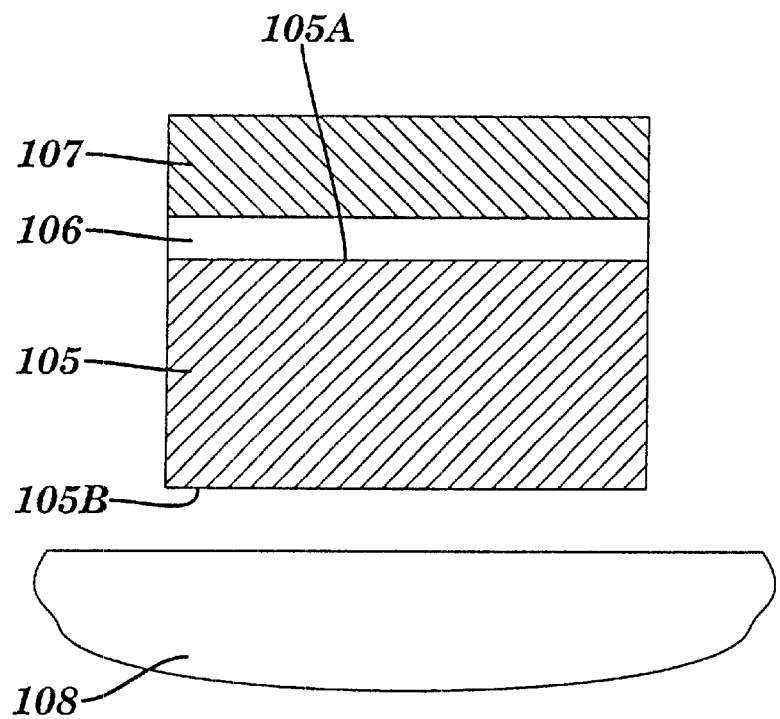
FIG. 4 is a cross-sectional view of semiconductor chip having an adhesion layer thereon and a reinforcing layer over the adhesion layer, in accordance with the method of the first embodiment of the present invention.

Referring now to the drawings, FIGS. 1, 3 and 4 depict a flow diagram and related structure for a first preferred embodiment of the present invention. First step 101 provides a semiconductor chip 105 that may be fashioned from silicon, gallium, arsenide, or the like. Semiconductor chip 105 has both top 105A and bottom 105B surfaces. In accordance with second step 102, an adhesion layer 106 is applied 102 over top surface 105A preferably by sputtering, however, it should be appreciated that many other means of applying adhesion layer 106 are known in the art and fall within the scope of this invention. Examples of application techniques include, inter alia, evaporation and plating. Adhesion layer 106 provides a base for reinforcing layer 107 which is bonded to semiconductor chip 105 in third step 103.

Although adhesion layer 106 is preferably chromium, it should be recognized that many other compounds exist that could be used to adhere reinforcing layer 107 to top surface 105A of semiconductor chip 105 and such components fall within the scope of this invention. For example, adhesion layer 106 could comprise titanium or palladium. The optimal thickness of adhesion layer 106 can range from about 50 to about 1,000 angstroms. However, the preferred thickness is about 300 to about 500 angstroms.

The final step 103, is to apply reinforcing layer 107 over adhesion layer 106 to prevent cracking of semiconductor chip 105. As shown in FIG. 4, reinforcing layer 107 overlies adhesion layer 106 which is disposed over top surface 105A of semiconductor chip 105. Reinforcing layer 107 can be applied by a number of known processes but is most preferably applied by evaporation, sputtering, electro plating, or electroless plating. Once reinforcing layer 107 is applied, semiconductor chip 105 comprises a reinforced structure capable of withstanding stress over its surface. Reinforcing layer 107 is preferably comprised of a metal and although many metals can be used as a reinforcing layer, aluminum, copper, or nickel is preferred. Moreover, reinforcing layer 107 should be applied in a thickness in a range of about 1,000 to about 40,000 angstroms, with a preferred thickness of at least 10,000 angstroms.

Lastly, metal reinforcing layer 107 should have a coefficient of thermal expansion greater in value than that of semiconductor chip 105 and comparable to organic substrate 108 to which semiconductor chip 105 is attached.

The difference in the CTEs between semiconductor chip 105 and organic substrate 108 and/or the presence of pre-existing defects in semiconductor chip 105 are, inter alia, what necessitates the application of reinforcing layer 107 to top surface 105A of chip 105.

First, the CTE of a typical semiconductor chip is approximately 2–3 ppm/°C. whereas the CTE for an organic substrate is about 17 ppm/°C. This differential indicates that organic substrate 108 is more flexible than the semiconductor chip 105 and, accordingly, substrate 108 will expand and contract at a faster rate than chip 105. This differential also indicates that bottom surface 105B of semiconductor chip 105, which is affixed to organic substrate 108, will be forced to expand and contract at a rate comparable to organic substrate 108. However, top surface 105A will continue to expand and contract at the slower rate typical to semiconductor materials. Without the present invention, structural defects, such as cracks, will appear along top surface 105A of semiconductor chip 105 resulting in degraded chip performance or chip failure.

By applying a reinforcing layer having a CTE greater than semiconductor chip 105 and comparable to organic substrate 108, the top surface 105A of chip 105 will expand and contract at an accelerated rate comparable to the chip's bottom surface 105B. The result is reduced structural defects along top surface 105A and a corresponding enhancement of chip performance. Although the CTE of metal reinforcing layer 107 is preferably about the same as that for organic substrate 108, it is not necessary for the coefficients to be equal.

In addition, semiconductor chips 105 having pre-existing defects are more likely to crack during thermal cycling or mechanical loading. By applying reinforcing layer 107 over adhesion layer 106, the uniformity of the overall structure will counteract any pre-existing defects and thus, the cracking of semiconductor chip 105 will be prevented.

In reinforcing semiconductor chip 105, the following experimental runs were performed:

Chromium was sputtered onto the top surface of a series of semiconductor chips at a thickness of 600 angstroms. Next, copper was sputtered on top of the chromium at a thickness of 10,000 angstroms on some of the semiconductor chips and 40,000 angstroms on the remaining semiconductor chips. The finished product exhibited good adhesion of the reinforcing layer to the semiconductor chip.

Upon completing steps 101–103, a reinforced semiconductor chip such as that shown in FIG. 4 will be provided. Specifically, semiconductor chip 105 has a top 105A and a bottom surface 105B. Reinforcing layer 107 is bonded over top surface 10SA by an intervening adhesion layer 106. The reinforced semiconductor chip can now be affixed to organic substrate 108 and subjected to thermal cycling without cracks or other defects appearing on top surface 105A.

Figure 2:
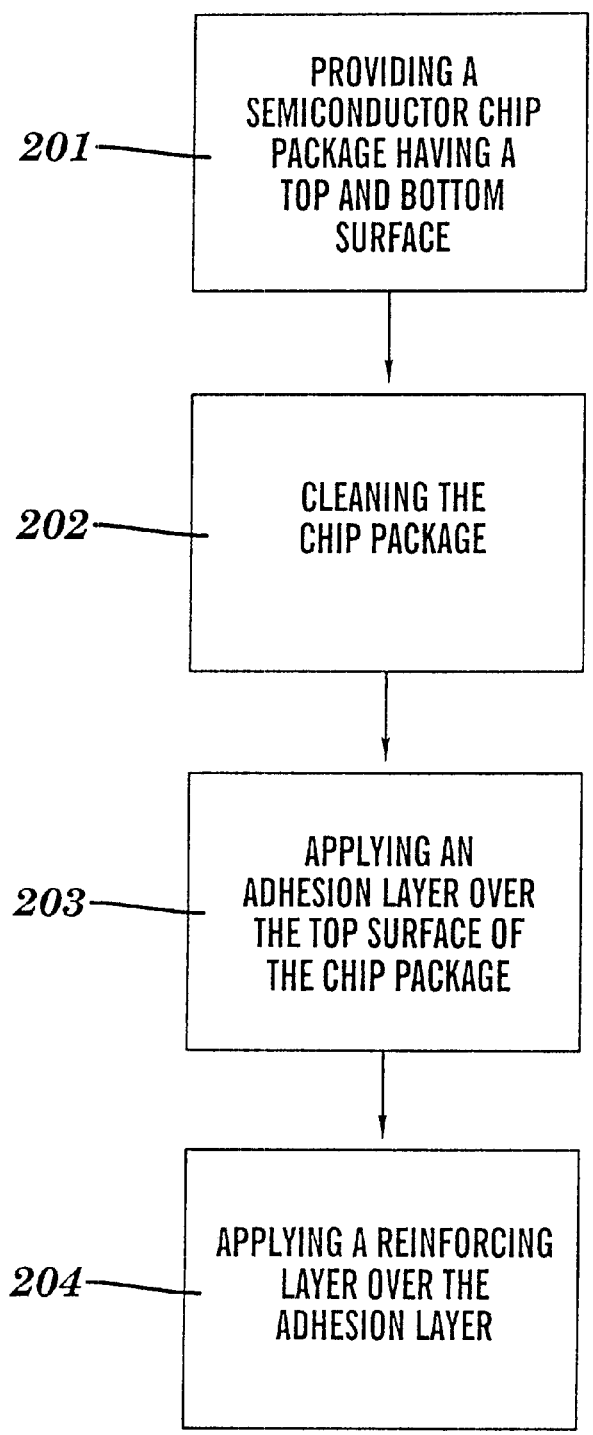
FIG. 2 is a flow diagram of the method of the second embodiment of the present invention.
Figure 5:
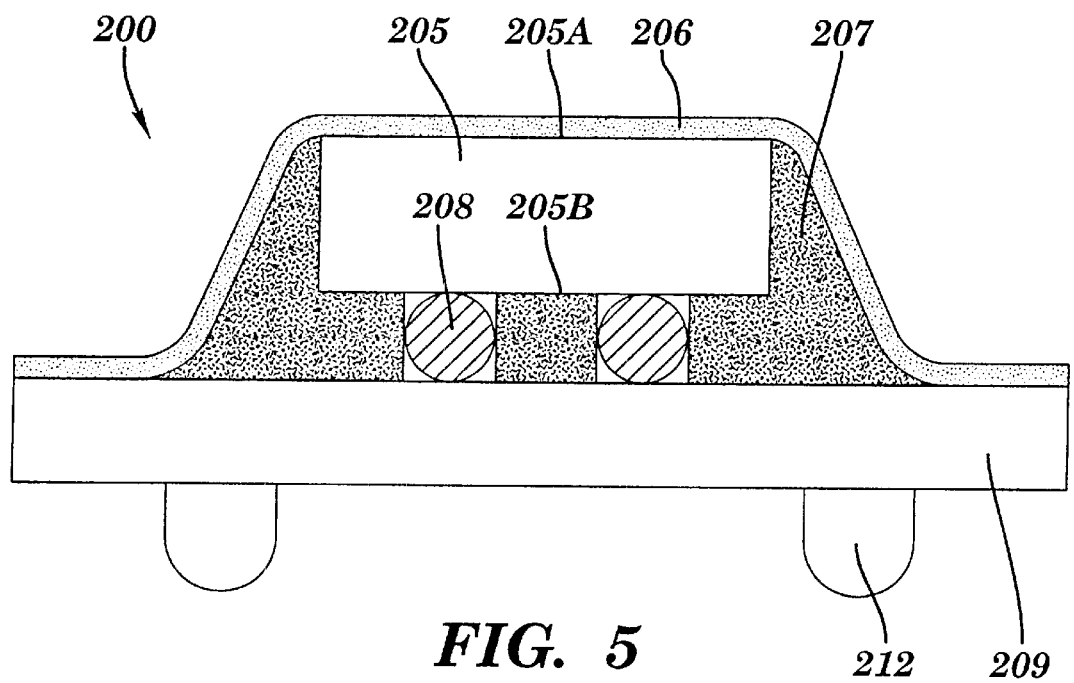
FIG. 5 is a cross-sectional view of a semiconductor chip package having an adhesion layer thereon, in accordance with the method of the second embodiment of the present invention.
Figure 6:
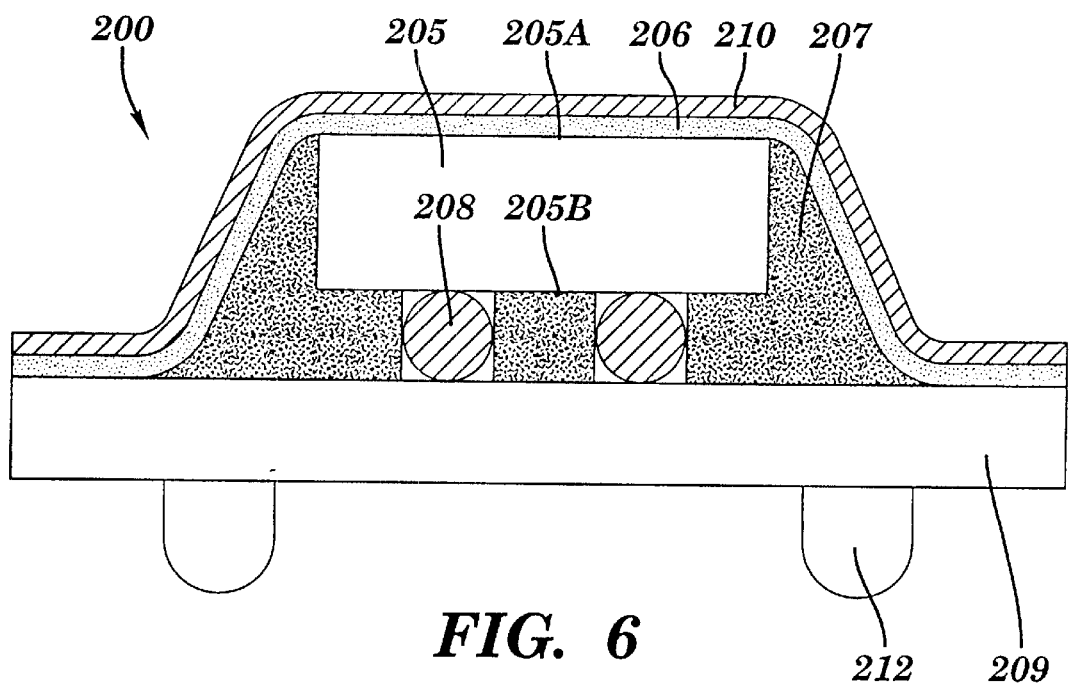
FIG. 6 is a cross-sectional view of a semiconductor chip package having an adhesion layer thereon and a reinforcing layer over the adhesion layer, in accordance with the second embodiment of the present invention.
Figure 7:
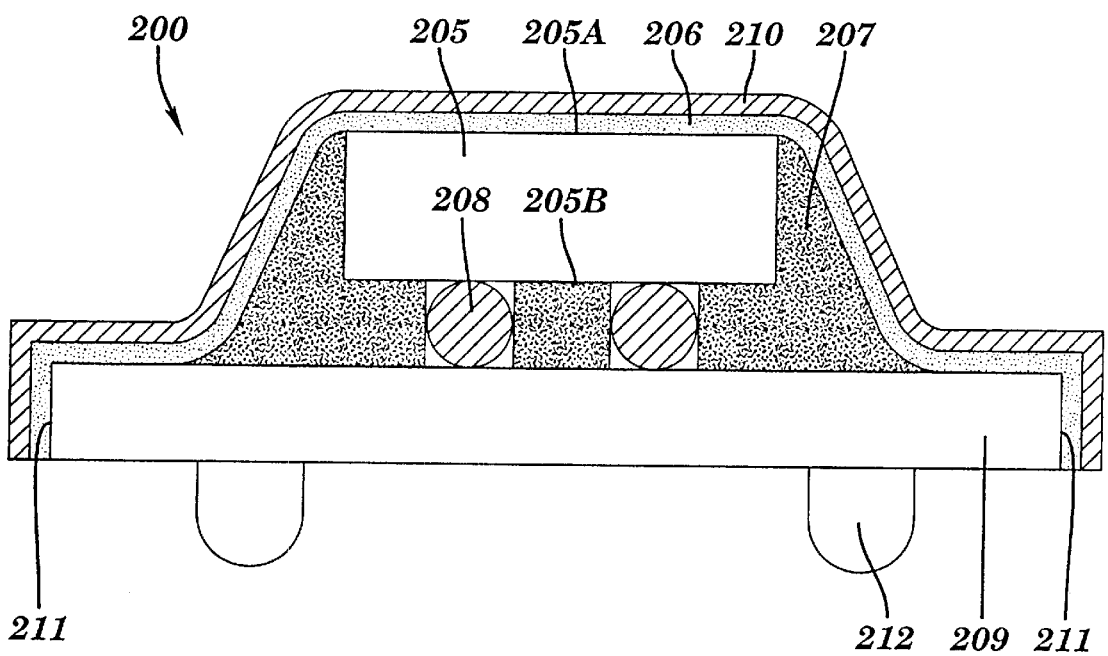
FIG. 7 is a cross-sectional view of a semiconductor chip package having an adhesion layer thereon and a reinforcing layer over the adhesion layer, in accordance with the second embodiment of the present invention.

Turning to FIGS. 2 and 5–7, a second preferred embodiment is shown. This embodiment provides for the application of a metal reinforcing layer to a top surface of a semiconductor chip package 200. Referring to FIG. 2, the first step 201 in the process is to provide a semiconductor chip package 200 having a top and bottom surface. While it is realized that semiconductor chip packages may take varying forms and include different components, FIGS. 5–7 show one example of such a package 200.

Referring to FIGS. 5–7, semiconductor chip 205 includes a top 205A and a bottom 205B surface and is mounted on an organic substrate 209 by controlled collapsed chip connection (C4) solder joints 208. Semiconductor chip 205 is preferably silicon, gallium, or arsenide and organic substrate 209 preferably comprises epoxy, cyanate ester, or other similar base. Surrounding C-4 solder joints 208 is encapsulant or underfill 207. The role of encapsulant 207 is to support and strengthen solder joints 208 in bonding semiconductor chip 205 to organic substrate 209. In the absence of encapsulant 207, solder joints 208 would be subject to high amounts of stress and the resulting instability could lead to a rupture in the bond between semiconductor chip 205 and organic substrate 209. Once semiconductor chip 205 is properly mounted on organic substrate 209, the substrate 209 may then be mounted on another substrate, for example, a printed circuit board (not shown) by a second set of solder joints 212.

After an assembled semiconductor chip package 200 has been provided, it must undergo a cleaning process 202 prior to application of an adhesion 206 and a metal 210 layer. The cleaning step 202 helps to reduce the number of foreign agents and contaminants on the surfaces of chip package 200 so that good adhesion will be ensured. Cleaning 202 is preferably a plasma process although it should be appreciated that many other cleaning processes exist which could properly rid the surfaces of chip package 200 of contaminants. An example of a plasma process includes a 3 minute treatment of the semiconductor chip package 200 by oxygen and plasma in a reactive ion etch reactor.

After a cleaned semiconductor chip package 200 has been provided, the third step 203 is to apply an adhesion layer 206 over the top surface thereof to provide a base for metal reinforcing layer 210 to bond to chip package 200. As observed in FIGS. 5–7, the top surface of the semiconductor chip package 200 includes the top surfaces of the: 1) semiconductor chip 205; 2) encapsulant 207; and 3) organic substrate 209. Although the application 203 of adhesion layer 206 is preferably accomplished by sputtering, it should be realized that many other techniques for this application exist. For example, adhesion layer 206 can be applied by evaporation. Moreover, it should be understood that while the form and components of chip packages varying, the defined surfaces of the package may vary as well.

Adhesion layer 206 preferably comprises chromium although many adhesives exist which could bond reinforcing layer 210 to chip package 200. For example, titanium or palladium could be used as an adhesive. In addition, the thickness of adhesion layer 206 is in the range of about 50 to about 1,000 angstroms and is preferably about 750 angstroms.

After adhesion layer 206 has been applied 203, the final step 204 is to apply reinforcing layer 210 over adhesion layer 206. Just as with the application of adhesion layer 20, reinforcing layer is applied to the entire top surface of semiconductor chip package 200, a surface which includes, inter alia, top surface 205A of semiconductor chip 205. FIG. 7 shows chip package 200 with both adhesion layer 206 and reinforcing layer 210 also overlying opposing sides 211 of organic substrate 209. By applying adhesion layer 206 and reinforcing layer 210 over opposing sides 211, substrate 209 is stiffened similar to an "I" beam configuration. Thus, the bond between semiconductor chip 205 and organic substrate 208 is further strengthened.

In applying the reinforcing layer 210 to semiconductor chip package 200, the preferred application technique is electro plating. However, it should be understood that other techniques such as sputtering, evaporation, or electroless plating may be used as well. Additionally, reinforcing layer 210 preferably comprises metal. Although many metals can be used as a reinforcing layer, aluminum, copper, or nickel is preferred. Similar to the first embodiment, the thickness of metal reinforcing layer 210 should be in the range at least 1,000 and its CTE should be greater than that of semiconductor chip 205 and comparable to organic substrate 209.

The difference in the CTE between semiconductor chip 205 and organic substrate 209 and/or the presence of pre-existing defects in semiconductor chip 105 is what necessitates the application of a reinforcing layer 210 to the top surface of chip package 200.

First, the CTE of a typical semiconductor chip is about 2–3 whereas the coefficient for an organic substrate 209 is approximately 17. This differential indicates that organic substrate 209 is more flexible than the semiconductor chip 205 and, accordingly, substrate 209 will expand and contract at a faster rate than semiconductor chip 205. This differential also indicates that bottom surface 205B of the semiconductor chip 205, which is affixed to the organic substrate 209, will be forced to expand at a rate comparable to organic substrate 209. However, top surface 205A will continue to expand and contract at the slower rate typical of semiconductor materials. When this occurs, structural defects, such as cracks, appear along the top surface 205A of the semiconductor chip 205 resulting in degraded chip performance or chip failure.

By applying a reinforcing layer having a CTE greater than semiconductor chip 205 and comparable to organic substrate 200, top surface 205A of chip 205 will expand and contract at an accelerated rate comparable to the device's bottom surface 205B. The result of this is reduced structural defects along top surface 205A of chip 205 and, accordingly, enhanced chip 105 performance. Although the CTE of metal reinforcing layer 210 is preferably about the same as that for organic substrate 209, it is not necessary for the coefficients to be equal.

In addition, semiconductor chips 205 having pre-existing defects are more likely to crack during thermal cycling or mechanical loading. By applying reinforcing layer 210 over adhesion layer 206, the uniformity of the overall structure will counteract any pre-existing defects and thus, the cracking.of semiconductor chip 205 will be prevented.

In reinforcing the semiconductor chip package 200, the following experimental runs were performed:

Chromium was sputtered on a series of semiconductor chip packages. Some packages were coated only on the top surface while others were coated on the top and side surfaces. Next, the chip packages were coated with a metal, some with copper and others with nickel. The coating was accomplished with an electro plating and was performed to thickness of 0.002 inches on some semiconductor chip packages and 0.004 inches on the others. In all cases, good adhesion of the metal reinforcing layers was observed.

Upon following the method set forth in steps 201–204, a reinforced semiconductor chip package 200 will be provided, such as that shown in FIGS. 6 and 7. Specifically, semiconductor chip 205 has a top 205A and a bottom surface 205B. Semiconductor chip 205 is bonded to organic substrate 209 by solder joints 208 which are surrounded by encapsulant or underfill 207. A metal reinforcing layer is bonded, by an intervening adhesion layer 206 over the top surface of chip package. The top surface of chip package 200 includes: 1) top surface 205A of semiconductor chip 205; 2) encapsulant 207; and 3) organic substrate 209 by intervening adhesion layer 206. In the embodiment of FIG. 7, adhesion 206 and metal 210 layer are also applied to opposing sides 211 of organic substrate 209. Once assembled, chip package 200 can be mounted on another substrate (not shown), such as a printed circuit board and/or subject to thermal cycling without cracks or other defects appearing along top surface 205A of semiconductor chip 205.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A reinforced semiconductor device comprising:
   a semiconductor device having a top and a bottom surface, wherein a reinforcing layer is coupled the top surface, wherein the reinforcing layer has a thickness in a range of 1000 angstroms to 40000 angstroms to prevent structural defects in the semiconductor device, and wherein the bottom surface is solderably coupled to a substrate.

2. The device of claim 1, wherein the reinforcing layer is metal.

3. The device of claim 2, wherein the metal is selected from a group consisting of aluminum, copper, and zinc.

4. The device of claim 1, wherein the device is a semiconductor chip.

5. The device of claim 4, wherein the reinforcing layer has a coefficient of thermal expansion greater than that of the semiconductor chip.

6. The device of claim 1, wherein the reinforcing layer is adhesively coupled to the top surface of the semiconductor chip.

7. A semiconductor chip package comprising:

an organic substrate;

a semiconductor chip is electrically coupled to the organic substrate; and a reinforcing layer adhesively coupled to a top surface of the chip and at least one surface of the substrate to prevent structural defects in the semiconductor chip, wherein an adhesion layer adhesively couples the reinforcing layer to the top surface of the chip and at least one surface of the substrate, and wherein the adhesion layer has a thickness in a range of about 50 angstroms to about 1000 angstroms.

8. The device of claim 7, wherein the reinforcing layer has a coefficient of thermal expansion greater than that of the semiconductor chip.

9. The device of claim 8, wherein the substrate has a coefficient of thermal expansion greater than that of the semiconductor chip.

10. The device of claim 9, wherein the substrate has a coefficient of thermal expansion about equal to that of the reinforcing layer.

11. A semiconductor chip package comprising:

an organic substrate;

a semiconductor chip electrically coupled to the organic substrate; and a reinforcing layer adhesively coupled to the a top surface of the chip and at least one surface of the substrate to prevent structural defects in the semiconductor chip, wherein an adhesion layer adhesively couples the reinforcing layer to the top surface of the chip and at least one surface of the substrate, wherein the adhesion layer has a thickness in a range of about 50 angstroms to about 1000 angstroms, wherein the reinforcing layer has a coefficient of thermal expansion greater than that of the semiconductor chip, and wherein the substrate has a coefficient of thermal expansion greater than that of the semiconductor chip.

12. The device of claim 11, wherein the substrate has a coefficient of thermal expansion about equal to that of the reinforcing layer.

\* \* \* \* \*